United States Patent [19]

Chambre

[11] Patent Number: 4,830,608
[45] Date of Patent: May 16, 1989

[54] BAKING OVEN FOR PRINTED CIRCUIT SUBSTRATES

[75] Inventor: Jacques Chambre, Paris, France

[73] Assignee: Compagnie D'Informatique Militaire Spatiale et Aeronautique, Paris, France

[21] Appl. No.: 91,330

[22] Filed: Aug. 31, 1987

Related U.S. Application Data

[63] Continuation of Ser. No. 858,768, May 2, 1986, abandoned.

[30] Foreign Application Priority Data

May 15, 1985 [FR] France ............................ 8507399

[51] Int. Cl.⁴ .............................................. F27B 9/28
[52] U.S. Cl. ...................................... 432/11; 432/133; 432/152; 432/128
[58] Field of Search ............... 432/64, 72, 128, 133, 432/152, 11; 98/47

[56] References Cited

U.S. PATENT DOCUMENTS

| | | | |
|---|---|---|---|
| 3,086,764 | 4/1963 | Beck | 432/64 |
| 3,100,106 | 8/1963 | Bielenberg et al. | 432/133 |
| 3,351,687 | 11/1967 | Thome et al. | 431/133 |
| 3,415,503 | 12/1968 | Beck | 432/128 |
| 3,601,375 | 8/1971 | Bowman | 432/152 |
| 3,869,249 | 3/1975 | Frische | 432/133 |
| 4,149,453 | 4/1979 | Reed | 98/47 |
| 4,235,591 | 11/1980 | Aebli | 432/152 |

FOREIGN PATENT DOCUMENTS 1508539 5/1974 Fed. Rep. of Germany .
2135032 8/1984 United Kingdom .

*Primary Examiner*—Henry C. Yuen
*Attorney, Agent, or Firm*—Pollock, VandeSande & Priddy

[57] ABSTRACT

An oven is provided for baking a substrate having a printed circuit obtained by depositing on an insulating substrate, by silk screen printing, an insulating or resistive ink comprising an organic material which forms a temporary binder of this ink, which oven is provided with gas injection means for baking in the desired atmosphere, means for extracting the reducing gases and/or baking residues obtained by transformation of the organic materials under the effect of the temperature, and means for sweeping these reducing gases in the direction of the extraction means so as to accelerate removal thereof without creating any zone of stagnation or turbulent flow.

4 Claims, 2 Drawing Sheets

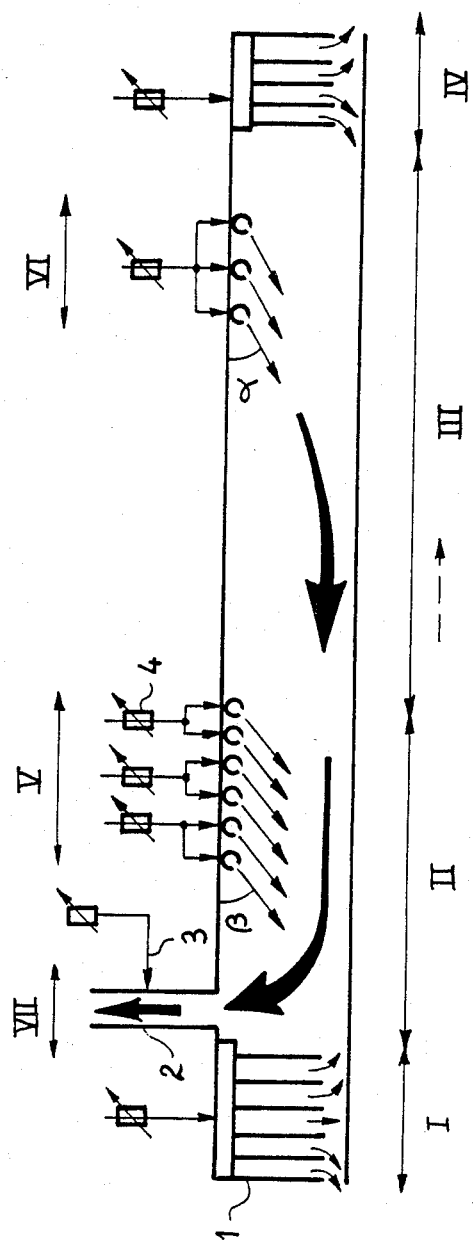
FIG_1

FIG_2
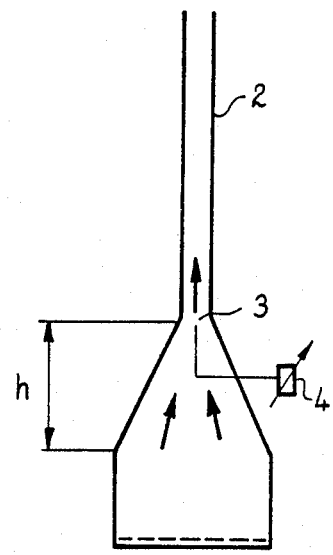
FIG_3
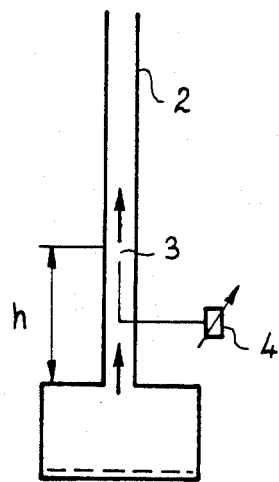

BAKING OVEN FOR PRINTED CIRCUIT SUBSTRATES

This application is a Continuation, of application Ser. No. 858,768 filed May 2, 1986 now abandoned.

BACKGROUND OF THE INVENTION

1. Field of the Invention

The present invention relates to the manufacture of printed circuits. It especially concerns the manufacture of printed circuit substrates, for example multilayer substrates, by silk screen printing deposit of a conducting ink and an insulating ink on an insulating substrate.

Baking is of prime importance in the manufacture of such a substrate. It is in fact during this very high temperature heat treatment that the materials acquire their mechanical and electrical properties, and the polymer resins or other organic constituents which form the temporary binding of the inks are eliminated.

2. Description of the Prior Art

The ovens used at the present time for carrying out this baking operation have been especially designed for baking in an oxidizing atmosphere (air) silk-screen printing conducting inks with a noble metal base such as gold.

These are continuous ovens, with a conveyor belt, having accesses toward the outside for introducing and receiving substrates, gas injection means for carrying out the baking in the desired atmosphere (air for noble metal based silk screen printing inks) and gas extraction means for extracting the residues obtained by elimination of the polymer resins during baking.

The elimination of the polymer resins, which takes place at the beginning of the baking cycle between 250° C. and 500° C., produces reducing gases.

When the baking takes place in air, which is the case for noble metal based silk screen printing inks, these reducing gases combine with the oxygen in the air before being eliminated by the extraction means;

On the other hand, when the silk screen printing ink used is based on a non-noble metal such as copper, baking requires a nitrogen atmosphere (neutral gas) with a very low oxygen concentration (partial oxygen pressure $10^{-5}$) so as to avoid oxidation of the copper due to the reactivity thereof.

Baking in a non-oxidizing atmosphere then raises a fundamental problem, which is the rapid elimination of these reducing gases. In fact, if certain conditions are present (proportion and type of polymer, operating conditions of the gases and loading rate of the oven), the presence of these reducing gases can seriously affect the properties of the materials. The ovens used at the present time do not solve this problem.

SUMMARY OF THE INVENTION

According to the invention, an oven for baking a substrate with a printed circuit obtained by depositing, on an insulating substrate, by silk screen printing, a conducting, insulating or resistive ink comprising an organic material which forms a temporary binder of this ink, comprises gas injection means for baking in the desired atmosphere, means for extracting the reducing gases and/or baking residues obtained by transformation of the organic materials under the effect of the temperature, and means for sweeping these reducing gases in the direction of the extraction means, so as to accelerate their removal without creating any zone of stagnation or turbulent flow.

According to another characteristic of the invention, the means for sweeping the reducing gases in the direction of the extraction means are obtained without addition of further elements, by simply modifying and improving the existing elements.

BRIEF DESCRIPTION OF THE DRAWINGS

The objects and features of the present invention will be clear from the following description of one embodiment, with reference to the accompanying drawings in which:

FIG. 1 is a view in longitudinal section of an oven in accordance with the invention;

FIGS. 2 and 3 are views in longitudinal section of extraction means equipping an oven of the invention.

DESCRIPTION OF THE PREFERRED EMBODIMENT

The temperatures existing inside the oven shown in FIG. 1 are such that this latter has a prebaking zone II, in which the temperature rises up to about 700° C., followed by a baking zone III in which the temperature rises up to about 900° C. The substrates to be baked move through the oven from the input I through which they are introduced, towards the output IV from which they are removed, and pass successively through the prebaking zone II, then through the baking zone III, that is to say in the direction of the broken line arrow.

Nitrogen is injected at the level of the inlet and the outlet of the oven. The inlet and the outlet of the oven are also equipped with metal curtains 1 for preventing the intake of air.

Nitrogen injection means, located at V and VI, are provided respectively in the prebaking zone and in the baking zone. Means, located at VII, are also provided for extracting the organic residues (or reducing gases) produced by heating of the polymer resins. These nitrogen injection means consist for example of rows of tubes, these tubes being disposed transversely (only their circular section is shown in the sectional view of FIG. 1) and are pierced with holes and connected to a nitrogen reservoir. The reducing gas extraction means consist for example of a chimney 2 having an injection system 3 (shown very schematically by a broken arrow) for reinforcing its efficiency.

The reducing gases produced by heating the polymer resins are produced by reactions which take place between 250° C. and 500° C., in the prebaking zone.

The means for sweeping these reducing gases in the direction of the extraction means so as to accelerate removal thereof without creating any zone of stagnation or turbulent flow which would maintain such stagnation, result from the conjunction of the following elements:

the nitrogen injection means located at VI, in the baking zone, are such that this nitrogen injection no longer takes place vertically, as was the case before, but is oriented towards the position of the extraction means, as is shown by the arrows in FIG. 1, and preferably at an angle $\alpha$ between 0° and 45°. In addition, these means are such that the injection tubes are provided with holes of a relatively large section (their diameter being advantageously greater than 3 mm). This latter characteristic avoids the suction of air through the outlet of the oven. Acquisition of the speed of the nitrogen flow for ensuring, in conjunction with the adequate orientation of this flow, non-turbulant operating conditions and good removal of the reducing gases is then obtained solely by the high temperature reigning in this zone.

similarly, the nitrogen injection provided in the prebaking zone by the means located at V is oriented in the direction of the extraction means (preferably at an angle $\beta$ between 20° and 45°). This reinforces the sweeping phenomenon previously created without creating turbulent conditions and compensates for the loss of speed of the nitrogen flow due to the reduction of the temperature in the prebaking zone. Another characteristic tending towards the same result is that the nitrogen injection tubes in the prebaking zone are provided with holes or relatively small section (for example less than or equal to 2 mm). Another characteristic also tending towards the same result is that the nitrogen injection tubes in the prebaking zone are relatively high in number (preferably greater than five) and are fed through independent flow meters, such as 4, so as to compensate for the differences of speed of the nitrogen flow due to the temperature differences between the different points where these tubes are set up in this zone.

Another characteristic tending towards the same result is further that the nitrogen injection means in the prebaking zone are located in a zone between 450° C. and 800° C., that is after the zone where the reducing gases are formed and not above this zone.

Means for extracting the reducing gases are no longer located, in just any place as was often the case before, but as close as possible to the zone where the reactions occur, so as to avoid as much as possible stagnation of these gases above the substrate. That reinforces then the sweeping phenomenon (symbolized by the thicker arrows in FIG. 1) by contributing to providing more rapid and more efficient removal of these gases. From the same point of view, the injector 3 equipping chimney 2 is placed as close as possible to the base of the chimney and preferably at a height h less than 200 mm, as can be seen in FIGS. 2 and 3 which show two embodiments of such an extraction system. In these diagrams can be seen the chimney 2, injector 3 and the flowmeter 4 controlling this injection system.

It should be emphasized that although the oven of the invention is particularly advantageous, even indispensable, for baking in a non oxidizing atmosphere, it may also be used advantageously for baking in an air atmosphere.

What is claimed is:

1. A process for baking an insulative printed substrate, the printing on said substrate being obtained by depositing thereon an insulative or resistive ink, said ink comprising an organic material which forms a temporary binder for said ink, said process comprising:
    introducing said printed substrate into a feed input end of an oven having a prebaking zone and a baking zone, whereby reducing gases are produced by transformation of said organic material under the effect of the temperature in said prebaking zone;
    extracting said reducing gases from said prebaking zone by introducing sweeping gas into said prebaking zone and removing a mixture of sweeping gas and reducing gases from said prebaking zone, wherein at least a portion of said sweeping gas is introduced into said prebaking zone through said baking zone, said portion of sweeping gas being introduced into said baking zone in a plurality of streams of sweeping gas at an angle from the horizontal from about 0° to about 45°, and wherein the flow of said sweeping gas into said prebaking zone is directed to said feed input end and is controlled to produce a laminar flow of gas in said prebaking zone and said baking zone thereby accelarating removal of said reducing gases without creating a zone of stagnant gases or turbulent flow of gases in said prebaking zone; and,
    introducing the resulting prebaked printed substrate into said baking zone.

2. A process in accordance with claim 1 wherein at least a portion of said sweeping gas is introduced directly into said prebaking zone in a plurality of streams of sweeping gas and said streams are introduced into said prebaking zone at an angle of from about 20° to about 45° from the horizontal.

3. A process in accordance with claim 2 wherein the flow rates of said plurality of streams of sweeping gas are independently controlled.

4. A process in accordance with claim 1 wherein at least a portion of said sweeping gas is introduced into said prebaking zone in a portion of said prebaking zone having a temperature greater than that at which said reducing gases are formed.

* * * * *